(12) United States Patent
Ismail et al.

(10) Patent No.: US 11,401,786 B2
(45) Date of Patent: Aug. 2, 2022

(54) SYSTEMS AND METHODS FOR HYDROCARBON RESERVOIR WELL CONNECTIVITY GRAPH OPTIMIZATION, SIMULATION AND DEVELOPMENT

(71) Applicant: Saudi Arabian Oil Company, Dhahran (SA)

(72) Inventors: Hibah M. Ismail, Dhahran (SA); Tareq M. Shaalan, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 704 days.

(21) Appl. No.: 16/294,292

(22) Filed: Mar. 6, 2019

(65) Prior Publication Data

US 2020/0284127 A1    Sep. 10, 2020

(51) Int. Cl.
*G06F 16/901*         (2019.01)
*G06F 30/20*          (2020.01)
(Continued)

(52) U.S. Cl.
CPC ............ *E21B 43/12* (2013.01); *E21B 47/022* (2013.01); *E21B 47/04* (2013.01); *G01V 99/005* (2013.01);
(Continued)

(58) Field of Classification Search
CPC ... G06F 30/20; G06F 16/9024; G01V 99/005; E21B 43/12; E21B 47/022; E21B 47/04; E21B 43/00; E21B 2200/20; E21B 49/00
See application file for complete search history.

(56) References Cited

U.S. PATENT DOCUMENTS 8,224,089 B2   7/2012 Nielsen
8,892,407 B2   11/2014 Budiman et al.
(Continued)

FOREIGN PATENT DOCUMENTS

EP   2431767 A2   3/2012

OTHER PUBLICATIONS

Holmes et al. "Application of a Multisegment Well Model to Simulate Flow in Advanced Wells" SPE 50646, Society of Petroleum Engineers [retrieved on Oct. 28, 2021] (Year: 1999).*
(Continued)

*Primary Examiner* — Rehana Perveen
*Assistant Examiner* — Alfred H B Wechselberger
(74) *Attorney, Agent, or Firm* — Bracewell LLP; Constance G. Rhebergen; Brian H. Tompkins

(57) ABSTRACT

Provided are embodiments that include segmenting a trajectory of a wellbore of a hydrocarbon well. For each segment, determining whether the segment includes a connection or a flow control element, and in response to determining that the segment includes a connection, generating a conduit link for the segment, in response to determining that the segment includes one or more flow control elements, generating an element link for the segment, or in response to determining that the segment does not include a connection or a flow control element, merging a modeling of the segment with modeling of a conduit link for an adjacent segment of the wellbore. Generating, based on the conduit links and element links generated, a reduced connectivity graph for the hydrocarbon well and a simulation of the hydrocarbon well.

27 Claims, 5 Drawing Sheets

(51) Int. Cl.
*G01V 99/00* (2009.01)
*E21B 43/12* (2006.01)
*E21B 47/022* (2012.01)
*E21B 47/04* (2012.01)
*E21B 43/00* (2006.01)

(52) U.S. Cl.
CPC .......... *G06F 16/9024* (2019.01); *G06F 30/20* (2020.01); *E21B 43/00* (2013.01); *E21B 2200/20* (2020.05)

(56) References Cited

U.S. PATENT DOCUMENTS

| | | | | |
|---|---|---|---|---|
| 9,164,191 | B2 * | 10/2015 | Dogru | G06F 30/20 |
| 9,217,313 | B2 * | 12/2015 | Shetty | E21B 43/00 |
| 10,061,060 | B2 | 8/2018 | Branets et al. | |
| 2002/0049575 | A1 | 4/2002 | Jalali et al. | |
| 2007/0299643 | A1 * | 12/2007 | Guyaguler | G01V 11/00 |
| | | | | 703/10 |
| 2014/0136116 | A1 | 5/2014 | Banian et al. | |
| 2014/0236558 | A1 * | 8/2014 | Maliassov | G01V 99/00 |
| | | | | 703/10 |
| 2016/0153265 | A1 | 6/2016 | Filippov et al. | |
| 2018/0181693 | A1 | 6/2018 | Yang | |

OTHER PUBLICATIONS

Holmes, J. "Modeling Advanced Wells in Reservoir Simulation" SPE72493, Society of Petroleum Engineers [retrieved on Oct. 28, 2021] (Year: 2001).*

Lerlertpakdee et al. "Efficient Production Optimization With Flow-Network Models" SPE 170241, Society of Petroleum Engineers [retrieved on Nov. 6, 2021] (Year: 2014).*

Al-Shaalan et al. "Parallel Computation for Complex Wells Modeling in Full-Field Reservoir Simulation" SPE-182657, Society of Petroleum Engineers [retrieved on Nov. 7, 2021] (Year: 2017).*

Dong, C. "An Integrated Multi-Component Reservoir-Wellbore Thermal Model" [Thesis] Department of Chemical and Petroleum Engineering, University of Calgary [retrieved on Mar. 18, 2022] (Year: 2012).*

Coats et al. "A Generalized Wellbore and Surface Facility Model, Fully Coupled to a Reservoir Simulator" SPE 79704, SPE Reservoir Simulation Symposium; Houston, Texas [retrieved on Oct. 27, 2021] (Year: 2003).*

Liu, J. "Three-phase network simulator for horizontal wells with complex advanced well completions" [Thesis] Engineering and Applied Science, Memorial University of Newfoundland [retrieved on Oct. 29, 2021] (Year: 2009).*

Bronwing, David J. et al., "Modeling Multi-tubing Wells in Reservoir Simulation", SPE 140891, SPE Reservoir Symposium, The Woodlands, Feb. 21-23, 2011; pp. 1-16.

International Search Report and Written Opinion for International Application No. PCT/US2020/021095 (SA51032PCT) dated Jun. 2, 2020; pp. 1-14.

Al-Shaalan et al.; "Parallel Computation for Complex Wells Modeling in Full-Field Reservoir Simulation" SPE-182657-MS, SPE Reservoir Simulation Conference, Montgomery, TX, Feb. 20-22, 2017; pp. 1-11.

Crumpton, P.I. et al.; "Multilateral-Complex Well Optimization" SPE 140882, SPE Reservoir Simulation Symposium, The Woodlands, TX, Feb. 21-23, 2011; pp. 1-12.

Fleming, Graham et al.; "A Parallel Solution for Large Surface Networks in a Fully Integrated Reservoir Simulator" SPE-182634-MS, SPE Reservoir Simulation Conference, Montgomery, TX, Feb. 20-22, 2017; pp. 1-14.

Halliburton "NETool" available as of Dec. 13, 2018 at the website: https://www.landmark.solutions/NETool; p. 1.

Jiang, Yuanlin; "Techniques for modeling complex reservoirs and advanced wells", Stanford University, 2007; pp. 1-220.

Wang, Qinghua et al.; "A New Approach to Improve Linear Solver Performance for a Fully Implicit Coupled System of Reservoir and Surface Network" SPE 163670, SPE Reservoir Simulation Symposium, The Woodlands, TX Feb. 18-20, 2013; pp. 1-16.

Wang, Qinghua et al.; "An Improved Slack Variable Method to Determine Active Constraints in Large Surface Networks" SPE-182640-MS, SPE Reservoir Simulation Conference, Montgomery, TX, Feb. 20-22, 2017; pp. 1-15.

* cited by examiner

SYSTEMS AND METHODS FOR HYDROCARBON RESERVOIR WELL CONNECTIVITY GRAPH OPTIMIZATION, SIMULATION AND DEVELOPMENT

FIELD

Embodiments relate generally to developing hydrocarbon reservoirs, and more particularly to hydrocarbon reservoir well development.

BACKGROUND

A rock formation that resides underground is often referred to as a "subsurface formation." A porous or fractured rock formation that contains, or that is expected to contain, a subsurface pool of hydrocarbons, such as oil and gas, is often referred to as a "hydrocarbon reservoir." In many instances, hydrocarbons are extracted (or "produced") from a hydrocarbon reservoir by way of a well. A well generally includes a wellbore (or "borehole") that is drilled into the Earth. A hydrocarbon well may extend into a hydrocarbon reservoir to, for example, facilitate the extraction of hydrocarbons from the reservoir, the injection of fluids into the reservoir, or the evaluation and monitoring of the reservoir.

Exploration for and production of hydrocarbons can involve many complex phases to optimize the extraction of hydrocarbons. For example, a reservoir engineer may spend time and effort assessing a hydrocarbon reservoir to identify economical and environmentally responsible ways to extract hydrocarbons from the reservoir. This can include identifying where the hydrocarbons are located and generating a field development plan (FDP) that outlines procedures for extracting hydrocarbons from the reservoir. In many instances, operators rely on simulations to characterize a reservoir (and wells in the reservoir) and develop a FDP based on the characterization. For example, an engineer may run simulations of a reservoir to determine where fluids, such as water and hydrocarbons, are located in the reservoir and how the fluids are expected to move within the reservoir. The engineer may use the simulation results to generate or adjust an FDP for the reservoir. In many instances, simulations are run and FDPs are updated over the course of development of a reservoir. For example, initial simulations may be run to determine locations, configurations and operating parameters for a first set of wells before they are drilled, and follow-up simulations may be run to determine updated operating parameters for the first set of wells already drilled, and locations, configurations and operating parameters for additional wells to be drilled. Thus, simulations can be an important aspect of developing a reservoir.

SUMMARY

Successful development of a hydrocarbon reservoir often depends on the ability to provide accurate and timely simulations of the reservoir, including simulation of wells extending into the reservoir. For example, a reservoir engineer may be able to predict movement and production of hydrocarbons and other substances, such as injected water, within a reservoir based on a simulation, and manage the reservoir accordingly. This can include locating and configuring wells, and adjusting well operating parameters, such as production and injection rates, to optimize extraction of hydrocarbons from the reservoir.

Simulations of reservoirs often involve representing a model of the properties of a reservoir (or "reservoir model") with a three-dimensional (3D) grid of individual cells, sometimes referred to as a "domain" of the model. In some instances, the grid can include millions or billions of cells. During a simulation run, the domain may be divided (or "partitioned") into subdomains (sometimes referred to as "sectors" or "partitions") that are processed in parallel by different computing processes. This can involve thousands of processors working in parallel, and exchanging information regarding the subdomain they are processing. For example, different groups of processors (or "processing cores") of a high performance computing (HPC) cluster may work in parallel on a respective subdomain to which they are assigned, including performing processing on the cells of the subdomain and sharing information with other groups of processors regarding cells that interface with one or more cells of the subdomain.

The domain may correspond to a connectivity graph that includes nodes (or "vertices") and link (or "edges"). Nodes may represent properties of corresponding locations in the reservoir, and links may represent relationships between respective pairs of nodes. For example, a pair of nodes may be associated with a "node" value that represent a property, such as a porosity or saturation at locations of the respective nodes, and a link between the nodes may be associated with a link value, such as an equation that models fluid flow (or "flux") between the two locations.

In the case of modeling a well in a reservoir simulation, the well may be represented or "modeled" as a subsurface network presented in a well connectivity graph (or "graph"), including nodes and links reflecting elements of the well. The elements may include, for example, laterals (or "branches") defining the path (or "trajectory") of the wellbore, wellbore conduit (or "pipe"), and flow control elements, such as perforations or flow control devices. Wellbore conduit may include piping (such as casing or production tubing) defining an interior passage in the wellbore that facilitates fluid flow through the wellbore. Perforations may include openings in the lining of the wellbore (such as holes in casing lining the wellbore) that facilitate the flow of fluids between the reservoir and the wellbore. Flow control devices may include devices (such as internal control devices (ICDs), inflow control valves (ICVs), packers or pumps) used to control the fluid flow in the well and the production from the well.

In some embodiments, the trajectory of a wellbore is divided into segments, and a representative graph is generated, including links representing the segments of the wellbore. For each link in the graph, there is typically a corresponding equation that models fluid flow "across" the link. The equation, for example, may model fluid flow across conduit or flow control devices in the length of the wellbore represented by the link. The equations may be expressed together as system of equations, written in a matrix form, which are solved to simulate the well.

Well simulations may be incorporated into a simulation of the surrounding portions of the reservoir to simulate (or "predict") the movement of fluids in the reservoir and corresponding production from the wells. As complexity of a well increases, the size and complexity of the graph for the well typically increases (for example, the number of nodes, links and equations in the graph increases), which can in turn require relatively intensive computationally processing to run simulations of the well and the reservoir. As the number of wells in a reservoir (or their complexity) increases, this can result in a significant increase in the processing overhead required to simulate the reservoir. Unfortunately, even with the implementation of parallel processing and a relatively large number of processors, simulations can still require a great deal of time to complete—in some instances taking hours, days, weeks or even months to complete. Thus, simulations can be costly from the perspective of computing resources that are required, and can introduce delays into the development of a reservoir. In the case of multiple engineers competing for limited computing resources, a field engineer may have to forgo simulations simply because the computing resources are not available. Accordingly, efficient use of computing resources can be helpful in providing accurate and timely simulations, and optimizing development of one or more reservoirs.

In view of these and other challenges of existing techniques for hydrocarbon reservoir simulation, developed are novel systems and methods for hydrocarbon reservoir well connectivity graph optimization, simulation and development. In some embodiments, connectivity graphs of complex wells are simplified to reduce the number/complexity of equations and the processing resources necessary for modeling and simulating the wells. In some embodiments, links of a well connectivity graph that do not include a connection between wellbore branches or a flow control element (such as a perforation or a flow control device) are combined with other links of the graph, which can reduce the complexity of the system of equations for simulating the well. For example, a link that does not correspond to a connection, a perforation or a flow control device may be "merged" with another link of the graph to generate a reduced (or "optimized") well connectivity graph. The merging of the two links may include merging the equations representative of flow across the length of the wellbore represented by the two links to generate a single link associated with a single equation that represents fluid flow across the length of the wellbore represented by the links. Accordingly, the reduced graph may include a "reduced" number of links and equations. In some embodiments, a system of equations for the reduced graph can be generated and solved to model and simulate the well.

Provided in some embodiments is a method that includes the following: segmenting a trajectory of a wellbore of a hydrocarbon well in a hydrocarbon reservoir to generate segments representing the wellbore, with each segment representing a given length of the wellbore; for each segment: determining whether the segment includes a connection or a flow control element (a connection corresponding to an intersection of the wellbore with a surface or an intersection of two branches of the wellbore, and a flow control element including a perforation or a flow control device adapted to regulate fluid flow in the wellbore); and, in response to determining that the segment includes a connection, generating a conduit link for the segment (the conduit link modeling fluid flow in conduit in the length of the wellbore represented by the segment); in response to determining that the segment includes one or more flow control elements, generating an element link for the segment (the element link modeling fluid flow for the one or more flow control elements of the segment); or in response to determining that the segment does not include a connection or a flow control element, merging a modeling of the segment with modeling of a conduit link for an adjacent segment of the wellbore; generating, based on the conduit links and element links generated, a reduced connectivity graph for the hydrocarbon well; and generating, based on the reduced connectivity graph, a simulation of the hydrocarbon well.

In some embodiments, a flow control device includes a mechanical device adapted to regulate fluid flow in the wellbore. In some embodiments, a mechanical device includes an internal control device (ICD), inflow control valve (ICV), a packer, or a pump. In certain embodiments, an adjacent segment of the wellbore for a segment includes a segment representing a length of the wellbore located immediately upstream of the length of the wellbore represented by the segment. In some embodiments, a conduit link for a segment includes an equation modeling fluid flow in conduit in the length of the wellbore represented by the segment. In certain embodiments, merging a modeling of the segment with a conduit link for an adjacent segment of the wellbore includes generating a single equation to model fluid flow in conduit in the length of the wellbore represented by the segment and the adjacent segment. In some embodiments, an element link for a segment includes one or more equations modeling fluid flow in flow control elements in the length of the wellbore represented by the segment. In certain embodiments, the method further includes generating a field development plan (FDP) for the hydrocarbon reservoir based on the simulation of the hydrocarbon well. In some embodiments, the method further includes: identifying well drilling parameters based on the simulation of the hydrocarbon well; and drilling a well in the hydrocarbon reservoir based on the well drilling parameters. In certain embodiments, the method further includes: identifying well operating parameters based on the simulation of the hydrocarbon well; and operating a well in the hydrocarbon reservoir based on the well operating parameters.

Provided in some embodiments is non-transitory computer readable storage medium including program instructions stored on the medium that are executable by a processor to perform the following operations: segmenting a trajectory of a wellbore of a hydrocarbon well in a hydrocarbon reservoir to generate segments representing the wellbore, with each segment representing a given length of the wellbore; for each segment: determining whether the segment includes a connection or a flow control element (a connection corresponding to an intersection of the wellbore with a surface or an intersection of two branches of the wellbore, and a flow control element including a perforation or a flow control device adapted to regulate fluid flow in the wellbore); in response to determining that the segment includes a connection, generating a conduit link for the segment (the conduit link modeling fluid flow in conduit in the length of the wellbore represented by the segment); in response to determining that the segment includes one or more flow control elements, generating an element link for the segment (the element link modeling fluid flow for the one or more flow control elements of the segment); and in response to determining that the segment does not include a connection or a flow control element, merging a modeling of the segment with modeling of a conduit link for an adjacent segment of the wellbore; generating, based on the conduit links and element links generated, a reduced connectivity graph for the hydrocarbon well; and generating, based on the reduced connectivity graph, a simulation of the hydrocarbon well.

In some embodiments, a flow control device includes a mechanical device adapted to regulate fluid flow in the wellbore. In certain embodiments, a mechanical device includes an internal control device (ICD), inflow control valve (ICV), a packer, or a pump. In some embodiments, an adjacent segment of the wellbore for a segment includes a segment representing a length of the wellbore located immediately upstream of the length of the wellbore represented by the segment. In certain embodiments, a conduit link for a segment includes an equation modeling fluid flow in conduit in the length of the wellbore represented by the segment. In some embodiments, merging a modeling of the segment with a conduit link for an adjacent segment of the wellbore includes generating a single equation to model fluid flow in conduit in the length of the wellbore represented by the segment and the adjacent segment. In certain embodiments, an element link for a segment includes one or more equations modeling fluid flow in flow control elements in the length of the wellbore represented by the segment. In some embodiments, the operations further include generating a field development plan (FDP) for the hydrocarbon reservoir based on the simulation of the hydrocarbon well. In certain embodiments, the operations further include: identifying well drilling parameters based on the simulation of the hydrocarbon well; and drilling a well in the hydrocarbon reservoir based on the well drilling parameters. In some embodiments, the operations further include: identifying well operating parameters based on the simulation of the hydrocarbon well; and operating a well in the hydrocarbon reservoir based on the well operating parameters.

Provided in some embodiments is a hydrocarbon reservoir development system that includes the following: a hydrocarbon reservoir control system non-transitory computer readable storage medium including program instructions stored on the medium that are executable by a processor to perform the following operations: segmenting a trajectory of a wellbore of a hydrocarbon well in a hydrocarbon reservoir to generate segments representing the wellbore, with each segment representing a given length of the wellbore; for each segment: determining whether the segment includes a connection or a flow control element, (a connection corresponding to an intersection of the wellbore with a surface or an intersection of two branches of the wellbore, and a flow control element including a perforation or a flow control device adapted to regulate fluid flow in the wellbore); in response to determining that the segment includes a connection, generating a conduit link for the segment (the conduit link modeling fluid flow in conduit in the length of the wellbore represented by the segment); in response to determining that the segment includes one or more flow control elements, generating an element link for the segment (the element link modeling fluid flow for the one or more flow control elements of the segment); and in response to determining that the segment does not include a connection or a flow control element, merging a modeling of the segment with modeling of a conduit link for an adjacent segment of the wellbore; generating, based on the conduit links and element links generated, a reduced connectivity graph for the hydrocarbon well; and generating, based on the reduced connectivity graph, a simulation of the hydrocarbon well.

In some embodiments, a flow control device includes a mechanical device adapted to regulate fluid flow in the wellbore. In certain embodiments, a mechanical device includes an internal control device (ICD), inflow control valve (ICV), a packer, or a pump. In some embodiments, an adjacent segment of the wellbore for a segment includes a segment representing a length of the wellbore located immediately upstream of the length of the wellbore represented by the segment. In certain embodiments, a conduit link for a segment includes an equation modeling fluid flow in conduit in the length of the wellbore represented by the segment. In some embodiments, merging a modeling of the segment with a conduit link for an adjacent segment of the wellbore includes generating a single equation to model fluid flow in conduit in the length of the wellbore represented by the segment and the adjacent segment. In certain embodiments, an element link for a segment includes one or more equations modeling fluid flow in flow control elements in the length of the wellbore represented by the segment. In some embodiments, the operations further include generating a field development plan (FDP) for the hydrocarbon reservoir based on the simulation of the hydrocarbon well. In certain embodiments, the operations further include: identifying well drilling parameters based on the simulation of the hydrocarbon well; and drilling a well in the hydrocarbon reservoir based on the well drilling parameters. In some embodiments, the operations further include: identifying well operating parameters based on the simulation of the hydrocarbon well; and operating a well in the hydrocarbon reservoir based on the well operating parameters.

Figure 1:
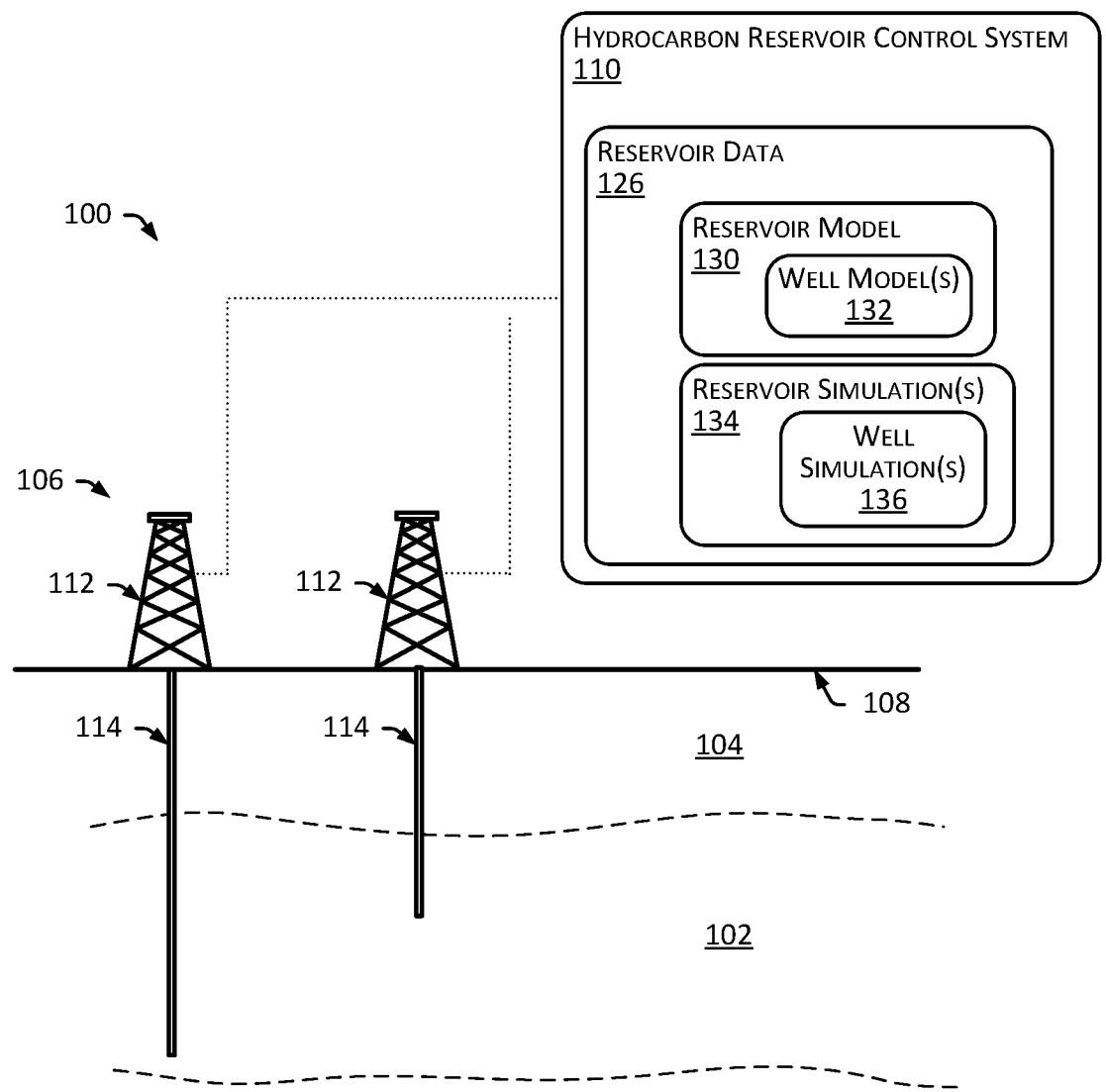
FIG. 1 is diagram that illustrates a hydrocarbon reservoir environment in accordance with one or more embodiments.

While this disclosure is susceptible to various modifications and alternative forms, specific embodiments are shown by way of example in the drawings and will be described in detail. The drawings may not be to scale. It should be understood that the drawings and the detailed descriptions are not intended to limit the disclosure to the particular form disclosed, but are intended to disclose modifications, equivalents, and alternatives falling within the spirit and scope of the present disclosure as defined by the claims.

DETAILED DESCRIPTION

Described are embodiments of novel systems and methods for hydrocarbon reservoir well connectivity graph optimization, simulation and development. In some embodiments, connectivity graphs of complex wells are simplified to reduce the number of equations and the processing resources necessary for modeling and simulating the wells. In some embodiments, links of a well connectivity graph that do not include a connection between wellbore branches or a flow control element (such as a perforation or a flow control device) are combined with other links of the graph, which can reduce the complexity of the system of equations for simulating the well. For example, a link that does not correspond to a connection, a perforation or a flow control device, may be "merged" with another link of the graph to generate a reduced (or "optimized") well connectivity graph. The merging of the two links may include merging the equations representative of flow across the length of the wellbore represented by the two links to generate a single link associated with a single equation that represents fluid flow across the length of the wellbore represented by the links. Accordingly, the reduced graph may include a "reduced" number of links and equations. In some embodiments, a system of equations for the reduced graph can be generated and solved to model and simulate the well.

FIG. 1 is a diagram that illustrates a hydrocarbon reservoir environment ("reservoir environment") 100 in accordance with one or more embodiments. In the illustrated embodiment, the reservoir environment 100 includes a hydrocarbon reservoir ("reservoir") 102 located in a subsurface formation ("formation") 104, and a hydrocarbon reservoir development system 106.

The formation 104 may include a porous or fractured rock formation that resides underground, beneath the Earth's surface ("surface") 108. The reservoir 102 may include a portion of the formation 104 that contains (or that is determined or expected to contain) a subsurface pool of hydrocarbons, such as oil and gas. The formation 104 and the reservoir 102 may each include different layers of rock having varying characteristics, such as varying degrees of permeability, porosity and fluid saturations. The hydrocarbon reservoir development system 106 may facilitate the extraction (or "production") of hydrocarbons from the reservoir 102.

In some embodiments, the hydrocarbon reservoir development system 106 includes a hydrocarbon reservoir control system ("control system") 110 and one or more wells 112. In some embodiments, the control system 110 includes a computer system that is the same as or similar to that of computer system 1000 described with regard to at least FIG. 5. Each of the wells 112 may be defined by a wellbore 114 that extends from the surface 108 into a target zone of the formation 104, such as the reservoir 102. The wellbore 114 may be created, for example, by a drill bit boring along a path (or "trajectory") through the formation 104 and the reservoir 102.

In some embodiments, the control system 110 controls certain operations for development of the reservoir 102. For example, the control system 110 may control logging operations used to acquire data for the reservoir 102, or control processing that generates models and simulations characterizing the wells 112 and the reservoir 102, based on the data acquired. In some embodiments, the control system 110 determines drilling parameters or operating parameters for wells 112 in the reservoir 102, or controls drilling or operating of the wells 112, in accordance with drilling or operating parameters. This can include, for example, the control system 110 determining drilling parameters (for example, determining well locations, trajectories and configurations) for the reservoir 102, controlling drilling and configuring of the wells 112 in accordance with the drilling parameters (for example, controlling a well drilling system of the hydrocarbon reservoir development system 106 to drill the wells 112 at the well locations and having the trajectories, as well as locating and configuring down-hole flow control elements, such as perforations, ICDs, ICVs, packers or pumps, in the wellbores of the wells 112), determining operating parameters (for example, determining production rates and pressures for "production" wells 112 or injection rates and pressure for "injections" wells 112), or controlling operations of the wells 112 in accordance with the operating parameters (for example, controlling a well operating system of the hydrocarbon reservoir development system 106 to configure flow control devices in the wells 112 to operate the production wells 112 to produce hydrocarbons from the reservoir 102 in accordance with the production rates and pressures determined for the respective wells 112, or to operate the injection wells 112 to inject substances, such as water, into the reservoir 102 in accordance with the injection rates and pressures determined for the respective wells 112). In some embodiments, the control system 110 determines monitoring parameters or controls operations of monitoring wells 112. For example, the control system 110 may determine wellbore logging parameters for monitoring wells 112, and control logging tools and sensors within the wellbores 114 of the monitoring wells 112 in accordance with the wellbore logging parameters for the respective monitoring wells 112.

In some embodiments, the control system 110 stores in a memory, or otherwise has access to, reservoir data 126. The reservoir data 126 may include data that is indicative of properties of the reservoir 102. In some embodiments, the reservoir data 126 includes one or more models 130 of the reservoir 102 (or "reservoir models" 130). A reservoir model 130 may include data representing properties of a portion of the reservoir 102. In some embodiments, a reservoir model 130 incorporates one or more well models 132. A well model 132 may include data representing properties of a well 112 that extends into the reservoir 102, such as the trajectory of the wellbore 114 of the well 112 and locations and configurations of conduit and flow control elements in the wellbore 114, such as perforations, ICDs, ICVs, packers or pumps, in the wellbore 114.

In some embodiments, the reservoir data 126 includes one or more simulations 134 of the reservoir 102 (or "reservoir simulations" 134). A reservoir simulation 134 may include a prediction of how fluid, such as hydrocarbons and water, will move through the reservoir 102 over time. A simulation 134 may be based, for example, on a reservoir model 130. In some embodiments, a reservoir simulation 134 incorporates a one or more well simulations 136. A well simulation 136 for a well 112 may include a prediction of fluid flow within the wellbore 114 of the well 112 over time. A reservoir simulation 134 may incorporate a prediction of fluid flow within a wellbore 114 when processing the portion of the reservoir 102 at or near the well 112, including processing of cells representing the portion of the reservoir surrounding the wellbore 114 of the well 112. In the case of a production well 112, a well simulation 136 for the well 112 may be incorporated into a reservoir simulation 134 to account for the flow of production through perforations, conduit, and flow control devices in the wellbore 114, as it moves from the reservoir 102 to the surface 108, by way of the well 112. In the case of an injection well 112, a well simulation 136 for the well 112 may be incorporated into a reservoir simulation 134 to account for the flow of injection substances through conduit, flow control devices and perforations in the wellbore 114, as it moves from the surface 108 into the reservoir 102, by way of the well 112.

In some embodiments, the domain of a reservoir model 130 is represented in "graph form." This can include each of the cells of the domain being represented by a node (or "vertex") of a connectivity graph, and each of the respective interfaces between pairs of adjacent cells of the domain being represented by a link (or "edge") of the graph, that extends between the respective nodes representing the cells of the pair of adjacent cells. In such a representation, each node representative of a location of rock in the reservoir 102 may be associated with (or be defined by) properties of the rock at the respective cell, such as a water saturation or porosity of the volume of the reservoir represented by the cell corresponding to the node. Each of the links may be associated with (or be defined by) properties of the corresponding interface between the respective cells of the pair of adjacent cells associated with the link, such as fluid flux between the pair of adjacent cells. In some embodiments, simulation of the reservoir 102 includes generating and processing the domain of a model 130 (for example, using the graph form of the domain) to generate a corresponding reservoir simulation 134.

In some embodiments, a portion of a domain corresponding to a well 112 (or the domain corresponding to a well model 132 for the well 112) is represented by a corresponding well connectivity graph (or "graph") for the well 112. The well connectivity graph may be, for example, a subset of a connectivity graph for the reservoir 102. In some embodiments, simulation of a well 112 includes generating and processing the portion of the domain corresponding to the well model 132 (for example, using the graph form of the domain for the well model 132) to generate a corresponding well simulation 136. In some embodiments, simulation of the reservoir 102 includes generating and processing the domain of a model 130 (for example, using the graph form of the domain of the well model 132 in conjunction with other portions of the reservoir 102) to generate a corresponding reservoir simulation 134.

In some embodiments, the trajectory of a wellbore 114 is divided into segments, and a representative well connectivity graph is generated, including links representing the segments of the wellbore 114. Each link in the graph may be associated with a corresponding equation that models fluid flow "across" the link. The equation, for example, may model fluid flow across conduit or flow control devices in the length of the wellbore 114 represented by the link. The equations may be expressed together as system of equations, written in a matrix form, which are solved to simulate the well 112.

As described here, in some embodiments, a connectivity graph is simplified to reduce the number/complexity of equations and the processing resources necessary for modeling and simulating the well 112. In some embodiments, a connectivity graph for a well 112 is simplified to reduce the number/complexity of equations and the processing resources necessary for modeling and simulating the well 112. In some embodiments, links of the graph that do not include a connection between wellbore branches or a flow control element of the well 112 (such as a perforation or a flow control device of the well 112) are combined with other links of the graph, which can reduce the complexity of the system of equations for simulating the well 112. For example, a link that does not correspond to a connection, a perforation or a flow control device of the well 112, may be "merged" with an adjacent-upstream link of the graph to generate a reduced (or "optimized") well connectivity graph. The merging of the two links may include merging the equations representative of flow across the length of the wellbore 114 represented by the two links to generate a single link associated with a single equation that represents fluid flow across the length of the wellbore 114 represented by the two links. Accordingly, the reduced graph may include a "reduced" number of links and equations modeling fluid flow in the well 112. In some embodiments, a system of equations for the reduced graph can be generated and solved to model and simulate the well 112 (for example, to generate a well simulation 136 for the well 112 or for use in generating a reservoir simulation 134 for the reservoir 102).

Figure 2:
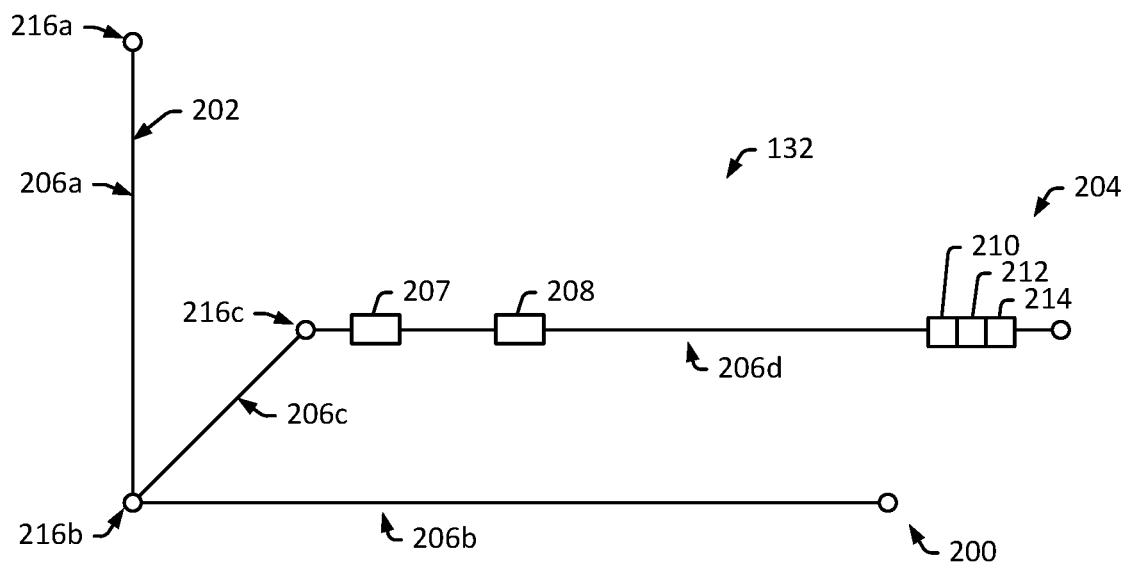
FIG. 2 is a diagram that represents a well model in accordance with one or more embodiments.

FIG. 2 is a diagram that illustrates a well model 132 for a well 112 in accordance with one or more embodiments. In the illustrated embodiment, the well model 132 includes a trajectory (or "path") 200 of the wellbore 114 of the well 112, and elements of the wellbore 114, including conduit 202 (for example, production tubing, casing or wellbore walls) that defines the flow path of the wellbore 114, and flow control devices 204 that regulate fluid flow within the wellbore 114. The trajectory 200 may be defined by a first branch 206a of the wellbore 114 (for example, a vertical motherbore of the wellbore 114), a second branch 206b of the wellbore 114 (for example, a first horizontal lateral branch of the wellbore 114), a third branch 206c of the wellbore 114 (for example, a second horizontal lateral branch of the wellbore 114), and a fourth horizontal lateral branch 206d of the wellbore 114 (for example, a third horizontal lateral branch of the wellbore 114). The flow control devices 204 may include, for example, a pump 207, an ICD 208, an ICV 210, packers 212 and perforations 214. The first branch 206a may intersect the surface 108 at a first connection 216a, the second and third branches 206b and 206c may intersect the first branch 206a at a second connection 216b, and the fourth branch 206d may intersect the third branch 206c at a third connection 216c.

Figure 3A:
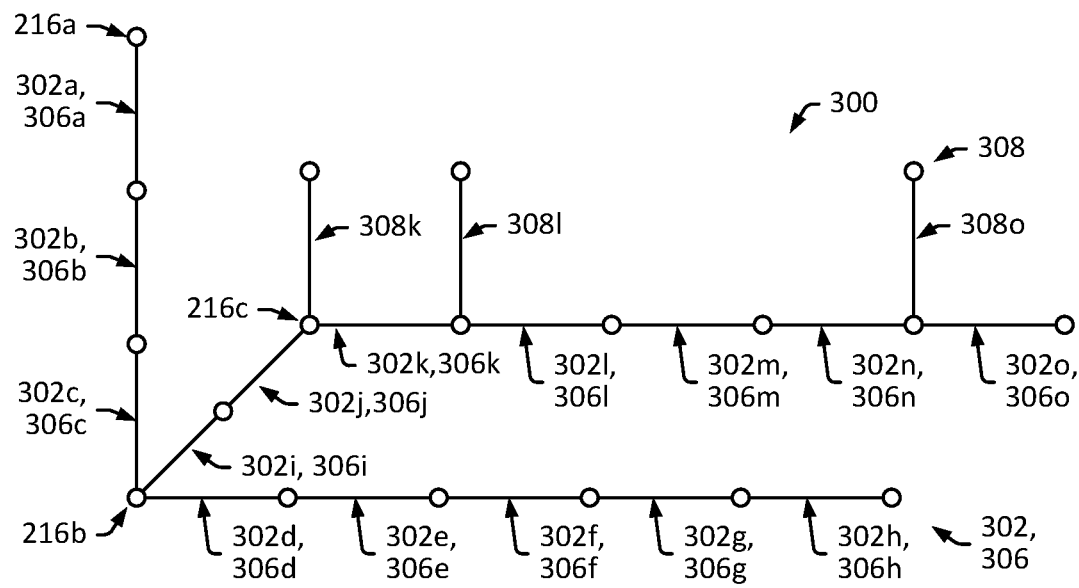
FIG. 3A is a diagram that illustrates a connectivity graph for a hydrocarbon well in accordance with one or more embodiments.

FIG. 3A is a diagram that illustrates a connectivity graph ("graph") 300 for the well modeled in FIG. 2 in accordance with one or more embodiments. In some embodiments, the connectivity graph 300 is generated by segmenting the trajectory 200 of the wellbore 114 into segments 302 that represent respective lengths of the wellbore 114. For example, the connectivity graph 300 may be generated by segmenting the entire length of the trajectory 200 of the wellbore 114 into 10 meter (m) segments to generate individual segments that each represent a respective 10 m length of the wellbore 114.

In some embodiments, each of the segments 302 is represented by a conduit link 306 associated with a modeling of fluid flow through the length of the wellbore 114 corresponding to the segment 302. If the length of the wellbore 114 corresponding to the segment includes a flow control element (for example, one of the pump 207, the ICD 208, the ICV 210, the packers 212 or the perforations 214), the segment 302 also includes a fluid flow element link (or "element link") 308 associated with a modeling of fluid flow through the fluid flow element(s) present in the corresponding length of the wellbore 114. For example, in the illustrated embodiment, the connectivity graph 300 includes the following: three segments 302a, 302b and 302c (represented by three conduit links 306a, 306b and 306c, respectively) representing the first branch 206a; five segments 302d, 302e, 302f, 302g and 302h (associated with five conduit links 306d, 306e, 306f, 306g and 306h, respectively) representing the second branch 206b of the wellbore; two segments 302i and 302j (associated with two conduit links 306i and 306j, respectively) representing the third branch 206c, and five segments 302k, 302l, 302m, 302n and 302o (associated with five conduit links 306k, 306l, 306m, 306n and 306o and three element links 308k, 308l and 308o) representing the fourth branch 206d. The first element link 308k may represent fluid flow for the pump 307 located on the length of the wellbore 114 represented by the segment 302k. The second element link 308l may represent fluid flow for the ICD 208 located on the length of the wellbore 114 represented by the segment 302i. The third element link 308o may represent fluid flow for the ICV 210, the packers 212, and the perforations 214 located on the length of the wellbore 114 represented by the segment 302o. In some embodiments, each of the conduit links 306 may be associated with an equation that models fluid flow across the conduit of the length of the wellbore 114 corresponding to the segment 302 associated with the link 306, and each of the element links 308 may be associated with one or more equations that model fluid flow across any flow control elements present in the length of the wellbore 114 corresponding to the segment 302 associated with the link 306.

In some embodiments, a reduced well connectivity graph ("reduced graph") corresponding to the connectivity graph 300 is generated to reduce the equations and processing resources necessary for modeling and simulating the well 112. For example, links associated with segments 302 that do not include a connection between wellbore branches or a flow control element (such as a perforation or a flow control device) are merged with links for other segments 302 of the graph. The merging of two links may include merging the equations associated with the links to generate a single link with an equation that represents fluid flow across the length of the conduit of the wellbore 114 represented by the two links. Referring to FIGS. 2 and 3, for example, equations associated with conduit links 306 of the "initial" connectivity graph 300 that do not correspond to the connections 216a, 216b or 216c, the pump 207, the ICD 208, the ICV 210, the packers 212 or the perforations 214, may be merged with an adjacent-upstream conduit link 306 to generate a reduced graph having single conduit links 306 that represent multiple conduit links 306 of the initial graph 300.

Figure 3B:
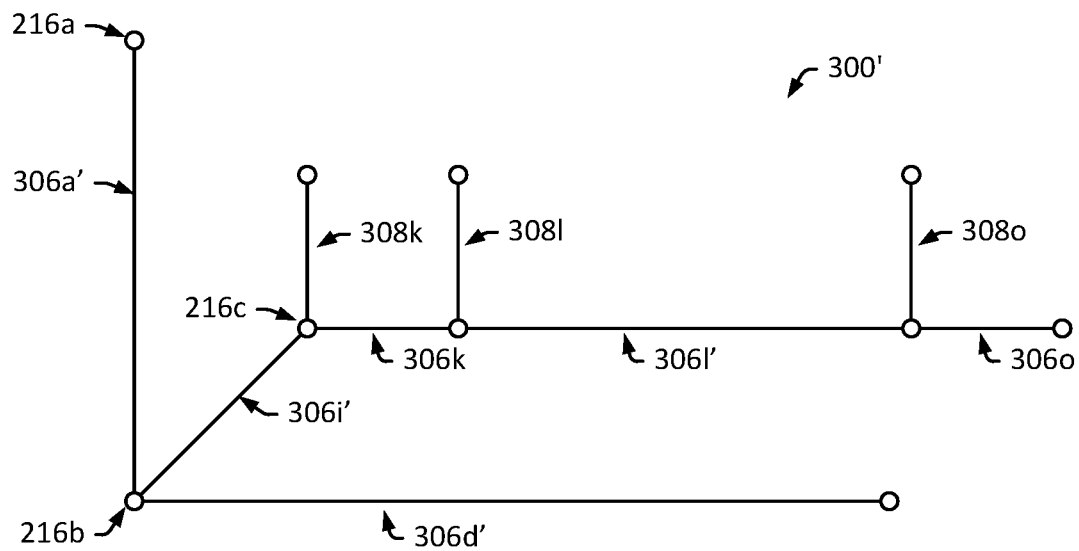
FIG. 3B is a diagram that illustrates a reduced connectivity graph for a hydrocarbon well in accordance with one or more embodiments.

FIG. 3B is a diagram that illustrates a reduced connectivity graph ("graph") 300' in accordance with one or more embodiments. In some embodiments, the reduced connectivity graph 300' is generated by identifying links associated with segments 302 that do not include a connection between wellbore branches or a flow control element (such as a perforation or a flow control device), and merging those links with other links of the graph 300. For example, generating the reduced connectivity graph 300' may include identifying links associated with segments 302 that do not correspond to the connections 216a, 216b or 216c, the pump 207, the ICD 208, the ICV 210, the packers 212 or the perforations 214, and merging each of the identified links with an adjacent-upstream link. For example, with reference to the model of FIG. 2 and graph 300 of FIG. 3, the following may be determined: the segment 302a includes the first connection 216a; the segments 302d and 302i each include the second connection 216b; the segment 302k includes the third connection 216c and the pump 207; the segment 302l includes the ICD 208; and the segment 302o includes the ICV 210, the packers 212 and the perforations 214. Further it may be determined that segments 302b, 302c, 302e, 302f, 302g, 302h, 302j, 302m and 302n do not include a connection or a flow control element.

Based on these determinations, the following may be conducted: (1) the equations associated with the conduit links 306b and 306c for segments 302b and 302c may be merged with the equation associated with the conduit link 306a for the segment 302a to generate a "merged" conduit link 306a' that is associated with a single equation modeling fluid flow across the conduit of the length of the wellbore 114 represented by the segments 302a, 302b and 302c (as opposed to the three separate equations modeling fluid flow across the conduit of the length of the wellbore 114 represented by the segments 302a, 302b and 302c); (2) the equations associated with the conduit links 306e, 306f, 306g and 306h for the segments 302e, 302f, 302g and 302h may be merged with the equation associated with the link 306d for segment 302d to generate a merged conduit link 306d' that is associated with a single equation modeling fluid flow across the conduit of the length of the wellbore 114 represented by the segments 302d, 302f, 302g and 302h (as opposed to four separate equations modeling fluid flow across the conduit of the length of the wellbore 114 represented by the segments 302d, 302f, 302g and 302h); (3) the equation associated with the conduit link 306j for segment 302j may be merged into the equation associated with the conduit link 306i for segment 302i to generate a merged conduit link 306i' that is associated with a single equation modeling fluid flow across the conduit of the length of the wellbore 114 represented by the segments 302i and 302j (as opposed to the two separate equations modeling fluid flow across the conduit of the length of the wellbore 114 represented by the segments 302i and 302j); and (4) the equations associated with the conduit links 306m and 306n for segments 302m and 302n may be merged into the conduit link 306l for segment 302l to generate a merged conduit link 306l' that is associated with a single equation modeling fluid flow across the conduit of the length of the wellbore 114 represented by the segments 302l, 302m and 302n (as opposed to the three separate equations modeling fluid flow across the conduit of the length of the wellbore 114 represented by the segments 302l, 302m and 302n). Further, the element links 308k, 308n and 308o for the segments 302k, 302n and 302o (determined to include a set of one or more fluid control devices), may be associated with a respective set of one or more equations modeling fluid flow across the set of one or more fluid control devices. For example, the element link 308k may be associated with one or more equations modeling fluid flow across the pump 209, the element link 308l may be associated with one or more equations modeling fluid flow across the ICD 208, and the element link 308o may be associated with one or more equations modeling fluid flow across the ICV 210, the packers 212 and the perforations 214.

In some embodiments, a system of equations for the reduced graph 300' can be generated and solved to model and simulate the well 112. For example, the equations for conduit links 306a', 302d', 302i', 302k, 302l' and 302o', and the equations for element links 308k, 308l and 308o, may be combined to generate a "reduced" system of equations for the reduced graph 300' that model the well 112, and the reduced system of equations may be solved to simulate the well 112. The number of equations in the system of equations for the reduced graph 300' may be less than the number of equations in the system of equations for the initial connectivity graph 300. As a result, modeling and simulating the well 112 using the reduced graph 300' may require less computing resources than modeling and simulating the well 112 using the initial connectivity graph 300. Further, simulations of the reservoir 102 including modeling and simulation of the well 112 using the reduced graph 300' may be completed faster (or using less computing resources) than simulations of the reservoir 102 using the initial connectivity graph 300.

Figure 4:
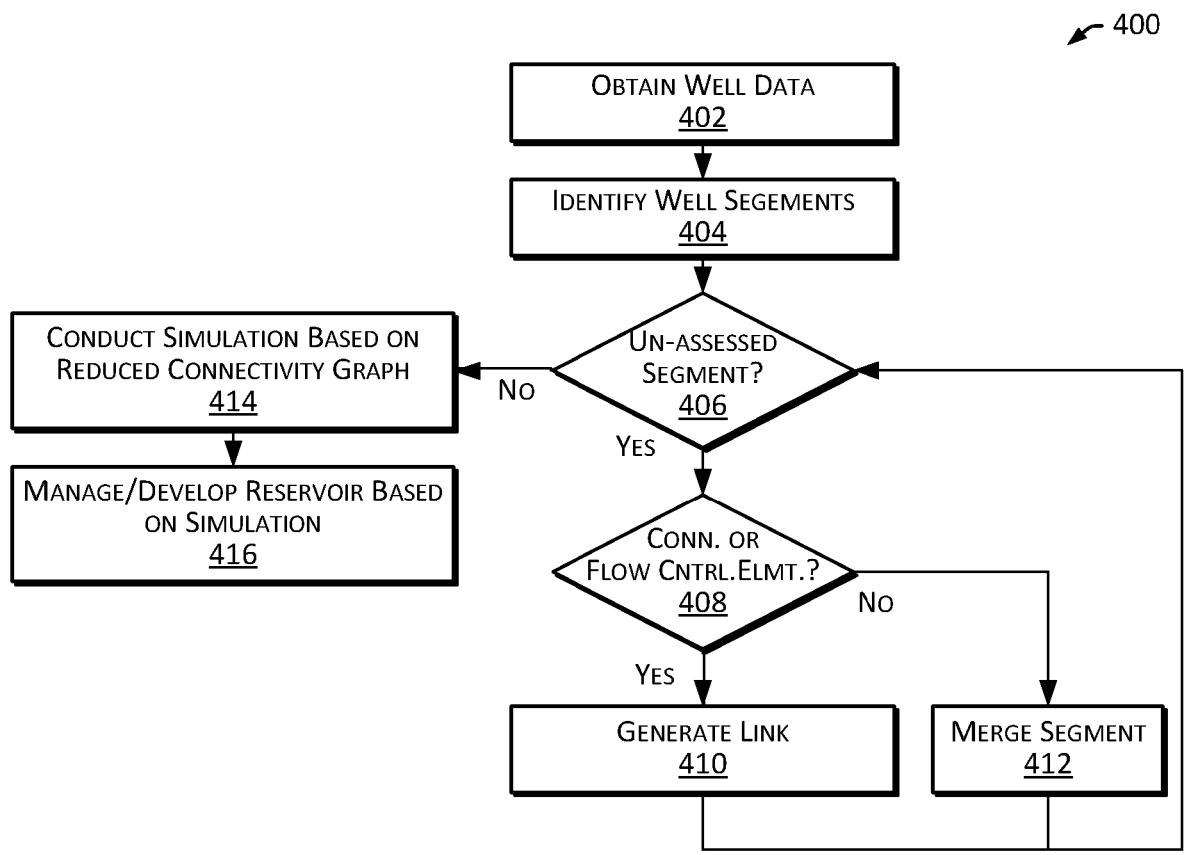
FIG. 4 is a flowchart that illustrates an example method of developing a hydrocarbon reservoir in accordance with one or more embodiments.

FIG. 4 is a diagram that illustrates a method 400 of reduced connectivity based reservoir simulation and development in accordance with one or more embodiments. Some or all of the procedural elements of method 400 may be performed, for example, by the control system 110 or another reservoir operator, such as a reservoir engineer. In some embodiments, the data generated by the procedural elements of method 400 may be stored in a memory, such as that of the control system 110, or displayed, such as on a graphical user interface of the control system 110.

In some embodiments, the method 400 includes obtaining well data (block 402). Obtaining well data may include obtaining data representing a well in a reservoir. For example, obtaining well data may include the control system 110 generating, retrieving or otherwise obtaining, a well model 132 defining properties of a well 112 of the reservoir 102. The properties may include a trajectory of a wellbore 114 of the well 112 (for example, including coordinates defining paths of one or more branches of the well 112), connections of the wellbore 114 (for example, including coordinates defining connections 116a, 116b and 116c), or identifying flow control elements of the wellbore 114 (for example, including data identifying the location, the type or the configuration of the pump 207, the ICD 208, the ICV 210, the packers 212 or the perforations 214).

In some embodiments, the method 400 includes identifying well segments (block 404). Identifying well segments may include segmenting the trajectory of the wellbore of a well to define segments that each represent a respective length of the wellbore. For example, identifying well segments may include the control system 110 segmenting the entire length of the trajectory 200 of the wellbore 114 into 10 m segments to generate individual segments (for example, segments 302a-302o) that each represent a respective 10 m length of the wellbore 114.

In some embodiments, the method 400 includes determining whether there are any unassessed segments (block 406). Determining whether there are any unassessed segments may include determining whether there are any segments of a well that have not yet been considered for merger with an adjacent segment. In a first iteration, none of the segments may have been considered, and, thus, it can be determined that there is an unassessed segment. For example, in a first iteration, determining whether there are any unassessed segments may include the control system 110 identifying a first segment (for example, segment 302a) as being unassessed. In a subsequent iteration, determining whether there are any unassessed segments may include the control system 110 identifying a second segment (for example, segment 302b) as being unassessed, and so forth, until all of the segments (for example, each of segments 302a-302o) have been assessed for reduction.

In some embodiments, the method 400 includes, in response to determining that there is an unassessed segment, proceeding to determining whether the unassessed segment identified includes a connection or a flow control element (block 408). Determining whether the unassessed segment identified includes a connection may include determining whether the segment identified includes a connection defined by a location where the wellbore intersects the surface, or a location where two branches of the wellbore intersect. Referring to the example discussed with regard to FIG. 3, in iterations considering segments 302a, 302d and 302k, the control system 110 may determine that the segments 302a, 302d and 302k include connections (for example, based on the segments 302a, 302d and 302k including connections 216a, 216b and 216c, respectively). Determining whether the unassessed segment identified includes a flow control element may include determining whether the segment identified includes a perforation or a flow control device, such as an ICD, an ICV, a packer or a pump. Referring to the example discussed with regard to FIG. 3, in iterations considering segments 302k, 302l and 302o, the control system 110 may determine that the segments 302k, 302l and 302o each include a flow control element (for example, based on the segments 302k, 302l and 302o including the pump 207, the ICD 208, and the ICV 210, the packers 212, and the perforations 214, respectively).

In some embodiments, the method 400 includes, in response to determining that the unassessed segment identified includes a connection or a flow control element, generating a link for the segment (block 410). Generating a link for the segment may include generating a link and an associated equation modeling fluid flow through the conduit and one or more equations modeling fluid flow for any control elements of the segment. For example, in the respective iterations considering the of the segments 302a, 302d and 302i, generating a link for segments may include the control system 110, generating (in the reduced connectivity graph 300') the respective conduit links 306a', 306d' and 306i', and associating each of the conduit links 306a', 306d' and 306i' with a respective equation modeling fluid flow across the conduit of the length of the wellbore 114 represented by the segments 302a, 302d and 302i. In an iteration considering the segment 302k, generating a link for the segment may include the control system 110 generating (in the reduced connectivity graph 300') the conduit link 306k' in association with an equation modeling fluid flow across the conduit of the length of the wellbore 114 represented by the segment 302k, and generating the element link 308k in association with one or more equations modeling fluid flow across the pump 207. In an iteration considering the segment 302l, generating a link for the segment may include the control system 110 generating (in the reduced connectivity graph 300') the conduit link 306l' in association with an equation modeling fluid flow across the conduit of the length of the wellbore 114 represented by the segment 302l, and generating the element link 308l that is associated with one or more equations modeling fluid flow across the ICD 208. In an iteration considering the segment 302o, generating a link for the segment may include the control system 110 generating (in the reduced connectivity graph 300') the conduit link 306o' in association with an equation modeling fluid flow across the conduit of the length of the wellbore 114 represented by the segment 302o', and generating the element link 308o that is associated with one or more equations modeling fluid flow across the ICV 210, for the packers 212, and across the perforations 214.

In some embodiments, the method 400 includes, in response to determining that the unassessed segment identified does not include a connection or a flow control element, merging the segment (block 412). Merging the segment may include updating an adjacent-upstream link (for example, link representing the segment immediately upstream (for example, closer to the intersection of the wellbore with the Earth's surface) of the identified segment) to incorporate an equation modeling fluid flow through the conduit of the segment. For example, in an iteration considering the segment 302b, the control system 110 may determine that the segment 302b does not include a connection or a flow control element, and, in response, update the already created conduit link 306a' to incorporate the equation modeling fluid flow through the conduit of the length of the wellbore 114 represented by the segment 302b. As a result, the conduit link 306a' may include a single "merged" equation representing fluid flow across the conduit of the length of the wellbore 114 represented by the segments 302a and 302b. A similar process may be performed for each of segments 302c, 302e, 302f, 302g, 302h, 302j, 302m and 302n to generate the "merged" conduit links 306d', 302i' and 302l', as described with regard to the reduced connectivity graph 300'.

In some embodiments, the method 400 includes, in response to determining that there are no unassessed segments (block 406), conducting a simulation based on the reduced connectivity graph (block 414). In some embodiments, conducting a simulation based on the reduced connectivity graph includes solving the system of equations of the reduced connectivity graph to generate a simulation of the well. For example, the control system 110 may solve the system of equations associated with the conduit links 306a', 302d', 302i', 302k, 302l' and 302o, and element links 308k, 308b and 308o of the reduced graph 300' to generate a well simulation 136 that is indicative of fluid flow in the well 112. In some embodiments, the system of equations for the reduced graph 300' (or the well simulation 136 generated using the system of equations for the reduced graph 300') is used to generate a reservoir simulation 134.

In some embodiments, solving the system of equations of a reduced connectivity graph includes solving network system Ax=b, where Ax is presenting the system of equations reflecting the complex well features (such as its branch trajectories and flow control elements of the well), where x includes the variables and A takes the following form:

$$A = \begin{pmatrix} A_{11} & A_{12} & A_{13} \\ A_{21} & T & A_{23} \\ A_{31} & A_{32} & A_{33} \end{pmatrix}$$

$$A_{21} = \begin{pmatrix} 0 & 0 & 0 & 0 & a21 \\ 0 & 0 & 0 & 0 & 0 \\ 0 & \ddots & \ddots & 0 & 0 \\ 0 & 0 & 0 & 0 & 0 \\ 0 & 0 & 0 & 0 & 0 \end{pmatrix}_{n \times m}$$

$$A_{23} == \begin{pmatrix} 0 & 0 & 0 & 0 & 0 \\ 0 & 0 & 0 & 0 & 0 \\ 0 & \ddots & \ddots & 0 & 0 \\ 0 & 0 & 0 & 0 & 0 \\ a23 & 0 & 0 & 0 & 0 \end{pmatrix}_{n \times l}$$

In some embodiments, solving further includes generating the network matrix presenting the complex well based on the graph built from previous step with all nodes and links created from complex well input, which include branch trajectories, and flow control elements for each branch. The matrix is presented in the form A, where T is the sub matrix presenting the flow control elements (based on the reduced connectivity graph). T would have the format below (without the reduction provided by the reduced connectivity graph), but the matrix will be reduced as a result of using the reduced connectivity graph. For example, instead of having n equations for n fluid flow control elements, there will be only one equation. The submatrix T will have the format below.

$$T = \begin{pmatrix} d_{1,1} & 0 & 0 & 0 & 0 \\ d_{2,1} & d_{2,3} & 0 & 0 & 0 \\ 0 & \ddots & \ddots & 0 & 0 \\ 0 & 0 & d_{n-1,n-1} & d_{n-1,n} & 0 \\ 0 & 0 & 0 & 0 & d_{n,n+1} \end{pmatrix}$$

$$T = (d_{1,1} \quad d_{n,n+1})$$

In some embodiments, solving further includes conducting a fast Thomas algorithm forward elimination for the submatrix T to solve the system, where there is a submatrix for each link, with any fluid flow control elements represented on that link. The solving can include solving the reduced network system, and conducting backward substitution for submatrix system T to find the solution x. In some embodiments, the solution x can be implemented in a simulation of a well, or as a portion of the simulation of the reservoir.

In some embodiments, the method 400 includes managing/developing the reservoir based on a simulation (block 416). Managing/developing the reservoir based on the simulation may include defining, or conducting, various operations for development of the reservoir based on the simulation of the reservoir. For example, managing/developing the reservoir based on a simulation may include the control system 110 (or another operator of the reservoir 102), based on a well simulation 136 (or a reservoir simulation 134) determined using the reduced graph 300', determining drilling parameters or operating parameters for wells 112 in the reservoir 102, or controlling drilling or operating of the wells 112 in accordance with the drilling or operating parameters. In some embodiments, a FDP may be generated for the reservoir 102, based on a well simulation 136 (or a reservoir simulation 134) determined using the reduced graph 300'. For example, the control system 110 or (another operator of the reservoir 102) may generate a FDP that specifies parameters for developing the reservoir 102, such as the drilling parameters or operating parameters for wells 112 in the reservoir 102, based on a well simulation 136 (or a reservoir simulation 134) determined using the reduced graph 300'.

Figure 5:
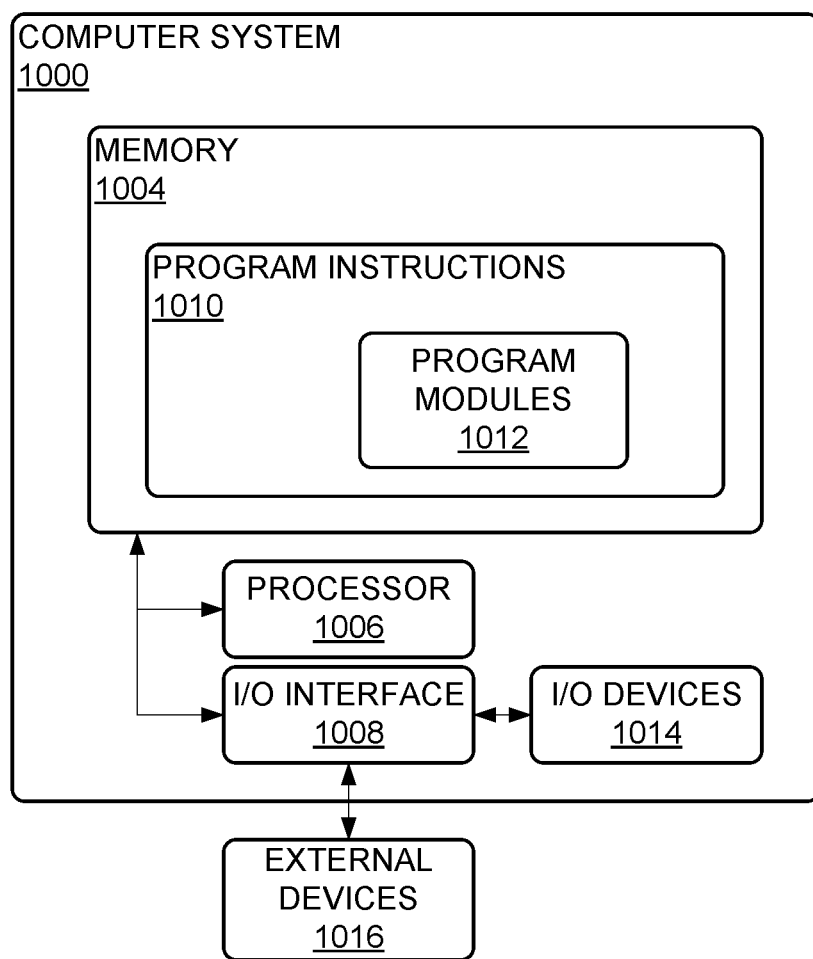
FIG. 5 is a diagram that illustrates an example computer system in accordance with one or more embodiments.

FIG. 5 is a diagram that illustrates an example computer system (or "system") 1000 in accordance with one or more embodiments. The system 1000 may include a memory 1004, a processor 1006 and an input/output (I/O) interface 1008. The memory 1004 may include non-volatile memory (for example, flash memory, read-only memory (ROM), programmable read-only memory (PROM), erasable programmable read-only memory (EPROM), electrically erasable programmable read-only memory (EEPROM)), volatile memory (for example, random access memory (RAM), static random access memory (SRAM), synchronous dynamic RAM (SDRAM)), or bulk storage memory (for example, CD-ROM or DVD-ROM, hard drives). The memory 1004 may include a non-transitory computer-readable storage medium having program instructions 1010 stored on the medium. The program instructions 1010 may include program modules 1012 that are executable by a computer processor (for example, the processor 1006) to cause the functional operations described, such as those described with regard to the control system 110 or the method 400.

The processor 1006 may be any suitable processor capable of executing program instructions. The processor 1006 may include one or more processors that carry out program instructions (for example, the program instructions of the program modules 1012) to perform the arithmetical, logical, or input/output operations described. The I/O interface 1008 may provide an interface for communication with one or more I/O devices 1014, such as a joystick, a computer mouse, a keyboard, or a display screen (for example, an electronic display for displaying a graphical user interface (GUI)). The I/O devices 1014 may include one or more of the user input devices. The I/O devices 1014 may be connected to the I/O interface 1008 by way of a wired connection (for example, an Industrial Ethernet connection) or a wireless connection (for example, a Wi-Fi connection). The I/O interface 1008 may provide an interface for communication with one or more external devices 1016, such as sensors, valves, pumps, motors, computers or communication networks. In some embodiments, the I/O interface 1008 includes an antenna or a transceiver.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described here are to be taken as examples of embodiments. Elements and materials may be substituted for those illustrated and described here, parts and processes may be reversed or omitted, and certain features of the embodiments may be utilized independently, all as would be apparent to one skilled in the art after having the benefit of this description of the embodiments. Changes may be made in the elements described here without departing from the spirit and scope of the embodiments as described in the following claims. Headings used here are for organizational purposes only and are not meant to be used to limit the scope of the description.

It will be appreciated that the processes and methods described here are example embodiments of processes and methods that may be employed in accordance with the techniques described here. The processes and methods may be modified to facilitate variations of their implementation and use. The order of the processes and methods and the operations provided may be changed, and various elements may be added, reordered, combined, omitted, modified, and so forth. Portions of the processes and methods may be implemented in software, hardware, or a combination thereof. Some or all of the portions of the processes and methods may be implemented by one or more of the processors/modules/applications described here.

As used throughout this application, the word "may" is used in a permissive sense (meaning having the potential to), rather than the mandatory sense (meaning must). The words "include," "including," and "includes" mean including, but not limited to. As used throughout this application, the singular forms "a," "an," and "the" include plural referents unless the content clearly indicates otherwise. Thus, for example, reference to "an element" may include a combination of two or more elements. As used throughout this application, the term "or" is used in an inclusive sense, unless indicated otherwise. That is, a description of an element including A or B may refer to the element including one or both of A and B. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (for example, by way of an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. A method comprising:
    segmenting a trajectory of a wellbore of a hydrocarbon well in a hydrocarbon reservoir to generate segments representing the wellbore, each segment representing a given length of the wellbore;
    for each segment:
        determining whether the segment comprises a connection or a flow control element, a connection corresponding to an intersection of the wellbore with a surface or an intersection of two branches of the wellbore, and a flow control element comprising a perforation or a flow control device configured to regulate fluid flow in the wellbore; and
        in response to determining that the segment comprises a connection, generating a conduit link for the segment, the conduit link modeling fluid flow in conduit in the length of the wellbore represented by the segment;
        in response to determining that the segment comprises one or more flow control elements generating an element link for the segment, the element link modeling fluid flow for the one or more flow control elements of the segment; or
        in response to determining that the segment does not comprise a connection or a flow control element, merging a modeling of the segment with modeling of a conduit link for an adjacent segment of the wellbore;
    generating, based on the conduit links and element links generated, a reduced connectivity graph for the hydrocarbon well;
    generating, based on the reduced connectivity graph, a simulation of the hydrocarbon well; and
    generating a field development plan (FDP) for the hydrocarbon reservoir based on the simulation of the hydrocarbon well.

2. The method of claim 1, wherein a flow control device comprises a mechanical device configured to regulate fluid flow in the wellbore.

3. The method of claim 2, wherein a mechanical device comprises an internal control device (ICD), inflow control valve (ICV), a packer, or a pump.

4. The method of claim 1, wherein an adjacent segment of the wellbore for a segment comprises a segment representing a length of the wellbore located immediately upstream of the length of the wellbore represented by the segment.

5. The method of claim 1, wherein a conduit link for a segment comprises an equation modeling fluid flow in conduit in the length of the wellbore represented by the segment.

6. The method of claim 5, wherein merging a modeling of the segment with a conduit link for an adjacent segment of the wellbore comprises generating a single equation to model fluid flow in conduit in the length of the wellbore represented by the segment and the adjacent segment.

7. The method of claim 1, wherein an element link for a segment comprises one or more equations modeling fluid flow in flow control elements in the length of the wellbore represented by the segment.

8. The method of claim 1,
    the FDP identifying well drilling parameters based on the simulation of the hydrocarbon well, and the method further comprising:

drilling a well in the hydrocarbon reservoir based on the well drilling parameters.

9. The method of claim 1, further comprising:
the FDP identifying well operating parameters based on the simulation of the hydrocarbon well, and the method further comprising:
operating a well in the hydrocarbon reservoir based on the well operating parameters.

10. A non-transitory computer readable storage medium comprising program instructions stored thereon that are executable by a processor to perform the following operations:
segmenting a trajectory of a wellbore of a hydrocarbon well in a hydrocarbon reservoir to generate segments representing the wellbore, each segment representing a given length of the wellbore;
for each segment:
determining whether the segment comprises a connection or a flow control element, a connection corresponding to an intersection of the wellbore with a surface or an intersection of two branches of the wellbore, and a flow control element comprising a perforation or a flow control device configured to regulate fluid flow in the wellbore;
in response to determining that the segment comprises a connection, generating a conduit link for the segment, the conduit link modeling fluid flow in conduit in the length of the wellbore represented by the segment;
in response to determining that the segment comprises one or more flow control elements generating an element link for the segment, the element link modeling fluid flow for the one or more flow control elements of the segment; and
in response to determining that the segment does not comprise a connection or a flow control element, merging a modeling of the segment with modeling of a conduit link for an adjacent segment of the wellbore;
generating, based on the conduit links and element links generated, a reduced connectivity graph for the hydrocarbon well;
generating, based on the reduced connectivity graph, a simulation of the hydrocarbon well; and
generating a field development plan (FDP) for the hydrocarbon reservoir based on the simulation of the hydrocarbon well.

11. The medium of claim 10, wherein a flow control device comprises a mechanical device configured to regulate fluid flow in the wellbore.

12. The medium of claim 11, wherein a mechanical device comprises an internal control device (ICD), inflow control valve (ICV), a packer, or a pump.

13. The medium of claim 10, wherein an adjacent segment of the wellbore for a segment comprises a segment representing a length of the wellbore located immediately upstream of the length of the wellbore represented by the segment.

14. The medium of claim 10, wherein a conduit link for a segment comprises an equation modeling fluid flow in conduit in the length of the wellbore represented by the segment.

15. The medium of claim 14, wherein merging a modeling of the segment with a conduit link for an adjacent segment of the wellbore comprises generating a single equation to model fluid flow in conduit in the length of the wellbore represented by the segment and the adjacent segment.

16. The medium of claim 10, wherein an element link for a segment comprises one or more equations modeling fluid flow in flow control elements in the length of the wellbore represented by the segment.

17. The medium of claim 10,
the FDP identifying well drilling parameters based on the simulation of the hydrocarbon well, and the operations further comprising:
drilling a well in the hydrocarbon reservoir based on the well drilling parameters.

18. The medium of claim 10,
the FDP identifying well operating parameters based on the simulation of the hydrocarbon well, and the operations further comprising:
operating a well in the hydrocarbon reservoir based on the well operating parameters.

19. A hydrocarbon reservoir development system comprising:
a hydrocarbon reservoir control system non-transitory computer readable storage medium comprising program instructions stored thereon that are executable by a processor to perform the following operations:
segmenting a trajectory of a wellbore of a hydrocarbon well in a hydrocarbon reservoir to generate segments representing the wellbore, each segment representing a given length of the wellbore;
for each segment:
determining whether the segment comprises a connection or a flow control element, a connection corresponding to an intersection of the wellbore with a surface or an intersection of two branches of the wellbore, and a flow control element comprising a perforation or a flow control device configured to regulate fluid flow in the wellbore;
in response to determining that the segment comprises a connection, generating a conduit link for the segment, the conduit link modeling fluid flow in conduit in the length of the wellbore represented by the segment;
in response to determining that the segment comprises one or more flow control elements generating an element link for the segment, the element link modeling fluid flow for the one or more flow control elements of the segment; and
in response to determining that the segment does not comprise a connection or a flow control element, merging a modeling of the segment with modeling of a conduit link for an adjacent segment of the wellbore;
generating, based on the conduit links and element links generated, a reduced connectivity graph for the hydrocarbon well;
generating, based on the reduced connectivity graph, a simulation of the hydrocarbon well; and
generating a field development plan (FDP) for the hydrocarbon reservoir based on the simulation of the hydrocarbon well.

20. The system of claim 19, wherein a flow control device comprises a mechanical device configured to regulate fluid flow in the wellbore.

21. The system of claim 20, wherein a mechanical device comprises an internal control device (ICD), inflow control valve (ICV), a packer, or a pump.

22. The system of claim 19, wherein an adjacent segment of the wellbore for a segment comprises a segment representing a length of the wellbore located immediately upstream of the length of the wellbore represented by the segment.

23. The system of claim 19, wherein a conduit link for a segment comprises an equation modeling fluid flow in conduit in the length of the wellbore represented by the segment.

24. The system of claim 23, wherein merging a modeling of the segment with a conduit link for an adjacent segment of the wellbore comprises generating a single equation to model fluid flow in conduit in the length of the wellbore represented by the segment and the adjacent segment.

25. The system of claim 19, wherein an element link for a segment comprises one or more equations modeling fluid flow in flow control elements in the length of the wellbore represented by the segment.

26. The system of claim 19,
the FDP identifying well drilling parameters based on the simulation of the hydrocarbon well, and the operations further comprising:
drilling a well in the hydrocarbon reservoir based on the well drilling parameters.

27. The system of claim 19,
the FDP identifying well operating parameters based on the simulation of the hydrocarbon well, and the operations further comprising:
operating a well in the hydrocarbon reservoir based on the well operating parameters.

* * * * *